United States Patent
Chan et al.

(10) Patent No.: US 8,947,953 B2
(45) Date of Patent: Feb. 3, 2015

(54) BIT CELL INTERNAL VOLTAGE CONTROL

(71) Applicant: Taiwan Semiconductor Manufacturing Company Limited, Hsin-Chu (TW)

(72) Inventors: Wei Min Chan, Sindian (TW); Yi-Tzu Chen, Hsinchu (TW); Wei-Cheng Wu, Hsinchu (TW); Yen-Huei Chen, Jhudong Township (TW); Hau-Tai Shieh, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 80 days.

(21) Appl. No.: 13/731,084

(22) Filed: Dec. 30, 2012

(65) Prior Publication Data

US 2014/0185363 A1    Jul. 3, 2014

(51) Int. Cl.
*G11C 7/10* (2006.01)
*G11C 5/14* (2006.01)
*G11C 7/22* (2006.01)
*G11C 11/419* (2006.01)

(52) U.S. Cl.
CPC  *G11C 5/147* (2013.01); *G11C 7/10* (2013.01); *G11C 7/22* (2013.01); *G11C 7/227* (2013.01); *G11C 11/419* (2013.01)
USPC .................. 365/189.16; 365/185.19; 365/93; 365/194; 365/230.03

(58) Field of Classification Search
CPC ...... G11C 7/1078; G11C 7/22; G11C 7/1006; G11C 7/1072; G11C 7/1096
USPC ............. 365/189.16, 185.19, 93, 194, 230.03
See application file for complete search history.

(56) References Cited

U.S. PATENT DOCUMENTS

| 5,748,560 A | * | 5/1998 | Sawada .................... 365/230.03 |
| 2008/0175077 A1 | | 7/2008 | Lee et al. |
| 2009/0316498 A1 | | 12/2009 | Chen et al. |

OTHER PUBLICATIONS

"Target Language Compiler Functions", TLC Function Library Reference (Target Language Compiler), pp. 15, Retrieved on Nov. 15, 2012, http://radio.feld.cvut.cz/matlab/toolbox/rtw/tlc_ref/cp_fcnl3.html.

* cited by examiner

*Primary Examiner* — Jason Lappas
(74) *Attorney, Agent, or Firm* — Cooper Legal Group, LLC

(57) ABSTRACT

Among other things, techniques for facilitating a write operation to a bit cell are provided. A pulse generator initializes lowering of an internal voltage level associated with a bit cell that is to be written to by a write operation. In this way, the bit cell is placed into a writeable voltage state, such that a potential of the bit cell can be overcome by the write operation. A voltage detector sends a reset signal to the pulse generator based upon the pulse generator lowering the internal voltage level past a reset trigger level. Responsive to receiving the reset signal, the pulse generator initializes charging of the internal voltage level to an original voltage level. In this way, the lowering of the internal voltage level is controlled so that one or more other bit cells are not affected (e.g., suffer data retention failure) by the relatively lower internal voltage level.

20 Claims, 5 Drawing Sheets

BIT CELL INTERNAL VOLTAGE CONTROL

BACKGROUND

A memory device, such as an SRAM device, comprises one or more bit cell arrays. A bit cell array comprises one or more bit cells. A bit cell can store a logical "1" (e.g., a relatively high voltage) or a logical "0" (e.g., a relatively low voltage). The bit cell is governed by an internal voltage level, such as a CVDD internal voltage level, that is supplied to the bit cell. A write operation to the bit cell can be successfully performed by overcoming the internal voltage level associated with the bit cell so that the write operation can store data within the bit cell. Success of the write operation can be enhanced by lowering the internal voltage level associated with the bit cell so that the write operation has less voltage potential to overcome. In addition, a minimum operational voltage of the memory device is improved (e.g., a lower VCCmin can be used to power the memory device) by enhancing the write operation.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

One or more systems and techniques for facilitating a write operation to a bit cell are provided herein. A memory device comprises one or more bit cells. A bit cell operates based upon an internal voltage level, such as a voltage used to maintain data within the bit cell. During a write operation, the internal voltage level is lowered so that a lower potential exists to effect a write operation. For example, a pulse generator, such as a loop control variable (LCV) pulse generator, for example, is configured to generate a voltage lowering pulse that triggers an LCV voltage generator to lower the internal voltage level. However, if the internal voltage level is lowered for too long, then one or more other bit cells within the memory device (e.g., bit cells within an unselected row) can suffer data retention failure.

Accordingly, as provided herein, a reset signal is used to trigger the pulse generator to initialize charging of the internal voltage level to an original voltage level, such as an external voltage level from which the internal voltage level is derived. In an embodiment, a voltage detector is configured to monitor the internal voltage level. The voltage detector sends the reset signal to the pulse generator based upon the pulse generator (e.g., through the LCV voltage generator) lowering the internal voltage level past a reset trigger level. In an embodiment, the voltage detector sets the reset trigger level based upon a data retention failure metric associated with one or more unselected bit rows that are susceptible to data retention failure due to the lowering of the internal voltage level. In another embodiment, the voltage detector maintains RC delay data associated with the internal voltage level (e.g., an RC delay associated with voltage variations along a wire carrying the internal voltage level, such as a CVDD_INT wire). In an embodiment, the RC delay data is associated with a timing delay caused by front-end device load and back-end metal RC loading (e.g., timing delay of the lowered internal voltage level being propagated from a near end to a far end of a bit cell column). The voltage detector can send the reset signal based upon the RC delay data. In this way, responsive to receiving the reset signal, the pulse generator initializes charging of the internal voltage level to the original voltage level so that other bit cells have adequate voltage to retain data stored therein.

The following description and annexed drawings set forth certain illustrative aspects and implementations. These are indicative of but a few of the various ways in which one or more aspects can be employed. Other aspects, advantages, and novel features of the disclosure will become apparent from the following detailed description when considered in conjunction with the annexed drawings.

DETAILED DESCRIPTION

Figure 1:
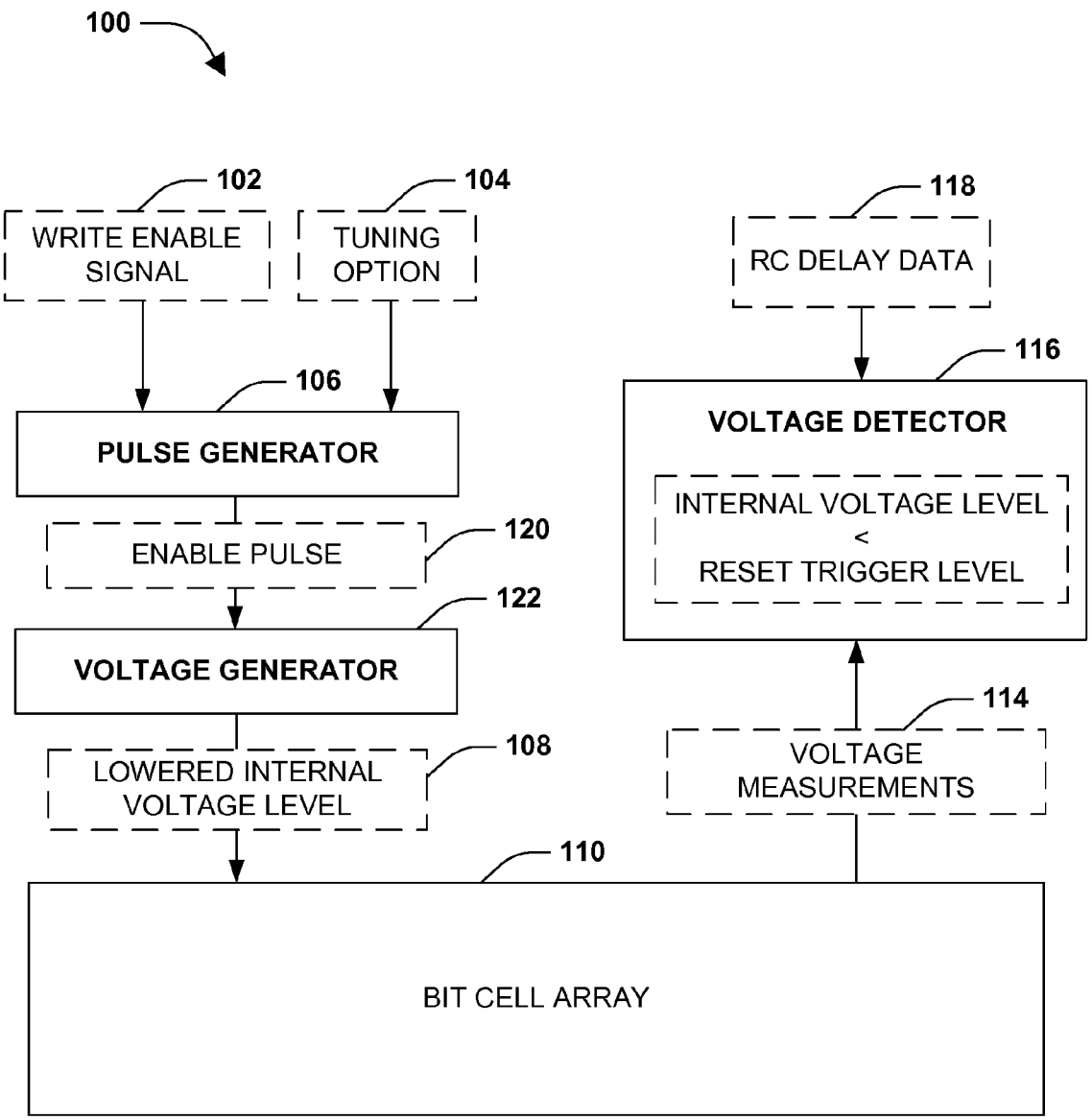
FIG. 1 is an illustration of an example of a system for facilitating a write operation to a bit cell, in accordance with various embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

FIG. 1 illustrates an example, in accordance with various embodiments, of a system 100 configured for facilitating a write operation to a bit cell. A memory device, such as an SRAM device, comprises one or more bit cell arrays, such as bit cell array 110. The bit cell array 110 comprises one or more bit cells. For example, the bit cell array 110 comprise a bit cell (A), a bit cell (B), a bit cell (C), a bit cell (D), a bit cell (E), a bit cell (F), and/or other bit cells not illustrated. One or more of the bit cells within the bit cell array 110 operate based upon an internal voltage level, such as a CVDD internal voltage level derived from an external voltage level for the memory device. Data can be written to a bit cell by a write operation, and data can be read from the bit cell by a read operation. During the write operation, an internal voltage level associated with the bit cell is lowered, such as by a voltage generator 122, so that the write operation can successfully write data to the bit cell. The internal voltage level is lowered so that the write operation can overcome a potential of the bit cell. However, if the internal voltage level is lowered for too long, then one or more other bit cells (e.g., bit cells within unselected rows) can suffer data retention failure. For example, lowering the internal voltage level during a write operation to the bit cell (A) can result in data retention issues for other bit cells, such as the bit cell (D), the bit cell (E), the bit cell (F), and/or other bit cells. Accordingly, as provided herein, a reset signal is used to control the lowering of the internal voltage level so that the internal voltage level is charged (e.g., to an original voltage level) once the internal voltage level is lowered past a reset trigger level.

In some embodiments of facilitating a write operation to a bit cell, the system 100 comprises a pulse generator 106, a voltage detector 116, and a voltage generator 122. The pulse generator 106 is configured to receive a write enable signal 102 associated with a bit cell (e.g., the write enable signal 102 may indicate that a write operation is to be performed on the bit cell (A)). Responsive to receiving the write enable signal 102, the pulse generator 106 initializes lowering 108 of an internal voltage level associated with the bit cell (A), for example, by sending an enable pulse 120 to the voltage generator 122. In some embodiments, the pulse generator 106 initializes lowering of the internal voltage level to a writable voltage state (e.g., a potential of the bit cell (A) can be overcome by the write operation). In some embodiments, the pulse generator 106 generates a voltage lowering pulse, such as the enable pulse 120, which controls lowering of the internal voltage level by a loop control variable pulse generator (e.g., FIG. 3). The pulse generator 106 can optionally generate the voltage lowering pulse based upon a tuning option 104 (e.g., a signal used to control various parameters of the voltage lowering pulse, such as a duration or pulse width).

The voltage detector 116 is configured to monitor the internal voltage level (e.g., voltage measurements 114) based upon a reset trigger level. The voltage detector 116 is configured to send a reset signal to the pulse generator 106 based upon the voltage generator 122 lowering 108 the internal voltage level past the reset trigger level (e.g., FIG. 2). Responsive to receiving the reset signal, the pulse generator 106 is configured to initialize charging of the internal voltage level to an original voltage level (e.g., an external voltage level) by the voltage generator 122. The reset signal is sent so that the internal voltage level is not lowered for a duration that would otherwise cause other bit cells to suffer data retention failure (e.g., the reset trigger level is based upon a data retention failure metric associated with one or more unselected bit rows). In some embodiments, the voltage detector 116 is configured to maintain RC delay data 118 associated with the internal voltage level, such as a wire loading delay, for example, of a wire carrying the internal voltage level that can suffer delay due to voltage variations along the wire. The voltage detector 116 can send the reset signal based upon the RC delay data 118. In an embodiment, the voltage detector 116 comprises a buffer, a skewed inverter buffer, a digital Schmitt trigger, or other voltage detection devices. In this way, the internal voltage level is lowered 108 during the write command for a duration that does not cause data retention issues with one or more other bit cells.

Figure 2:
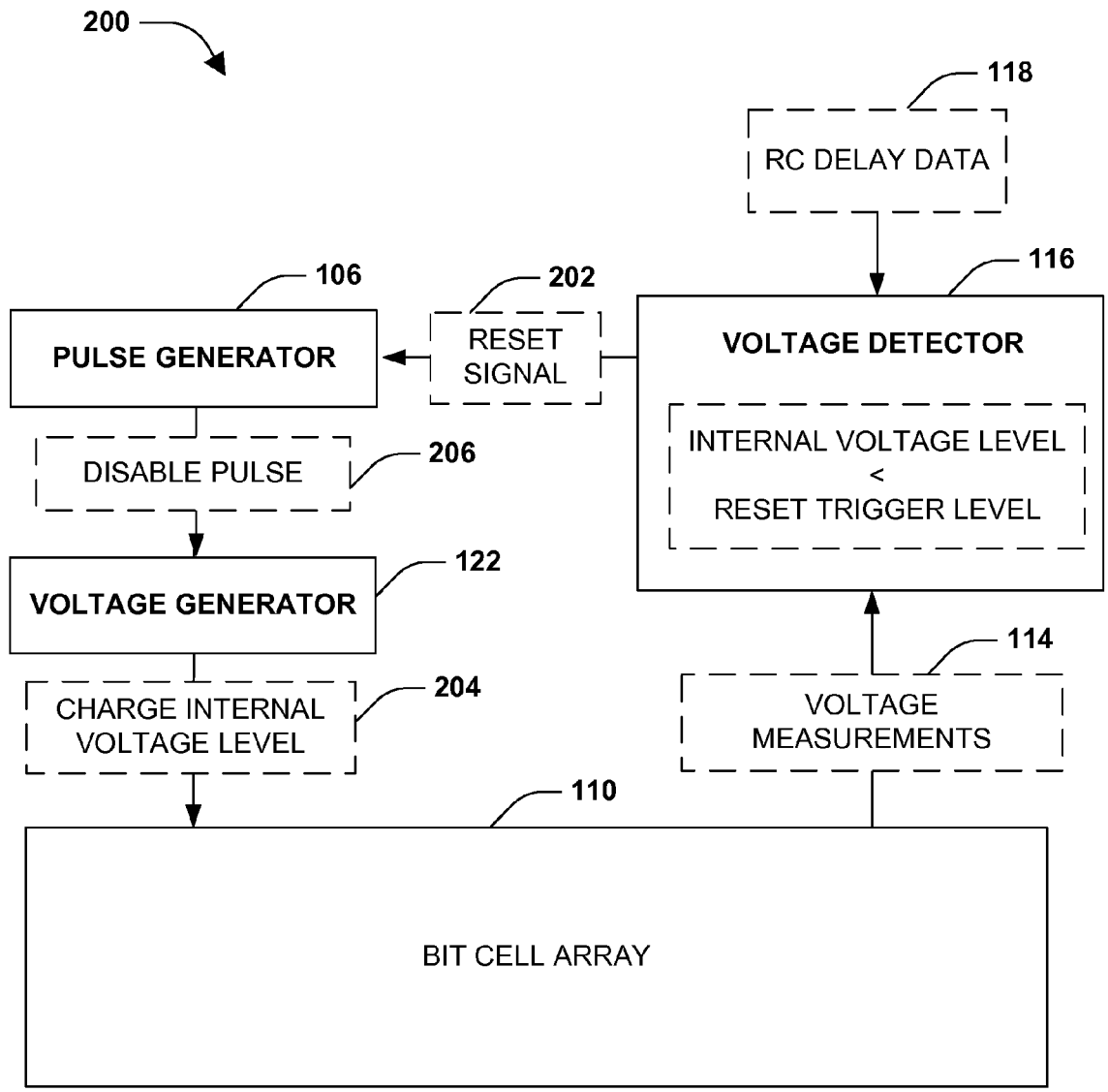
FIG. 2 is an illustration of an example of a system for facilitating a write operation to a bit cell, in accordance with various embodiments.

FIG. 2 illustrates an example, in accordance with various embodiments, of a system 200 configured for facilitating a write operation to a bit cell. A bit cell array 110 of a memory device comprises one or more bit cells, such as a bit cell (A). The system 200 comprises a pulse generator 106, a voltage generator 122, and a voltage detector 116 associated with the memory device. In some embodiments, the pulse generator 106 is configured to initialize lowering of an internal voltage level, such as a CVDD internal voltage, associated with the bit cell (A), for example, by the voltage generator 122 so that a write operation can be performed on the bit cell (A) (e.g., lowering 108 of FIG. 1).

The voltage detector 116 is configured to monitor the internal voltage level (e.g., voltage measurements 114). In some embodiments, the voltage detector 116 is configured to compare the internal voltage level with a reset trigger level. Responsive to voltage generator 122 lowering the internal voltage level past the reset trigger level, the voltage detector 116 is configured to send a reset signal 202 to the pulse generator 106. In some embodiments, the voltage detector 116 sends the reset signal 202 based upon RC delay data 118 associated with the internal voltage level (e.g., an RC delay associated with CVDD internal wire loading). Upon receiving the reset signal 202, the pulse generator 106 is configured to send a disable pulse 206 to the voltage generator 122 which causes the voltage generator 122 to charge 204 the internal voltage level to an original voltage level, such as an external voltage level. In this way, the voltage generator 122 does not lower the internal voltage level past a duration that would otherwise cause one or more other bit cells to suffer data retention issues.

Figure 3:
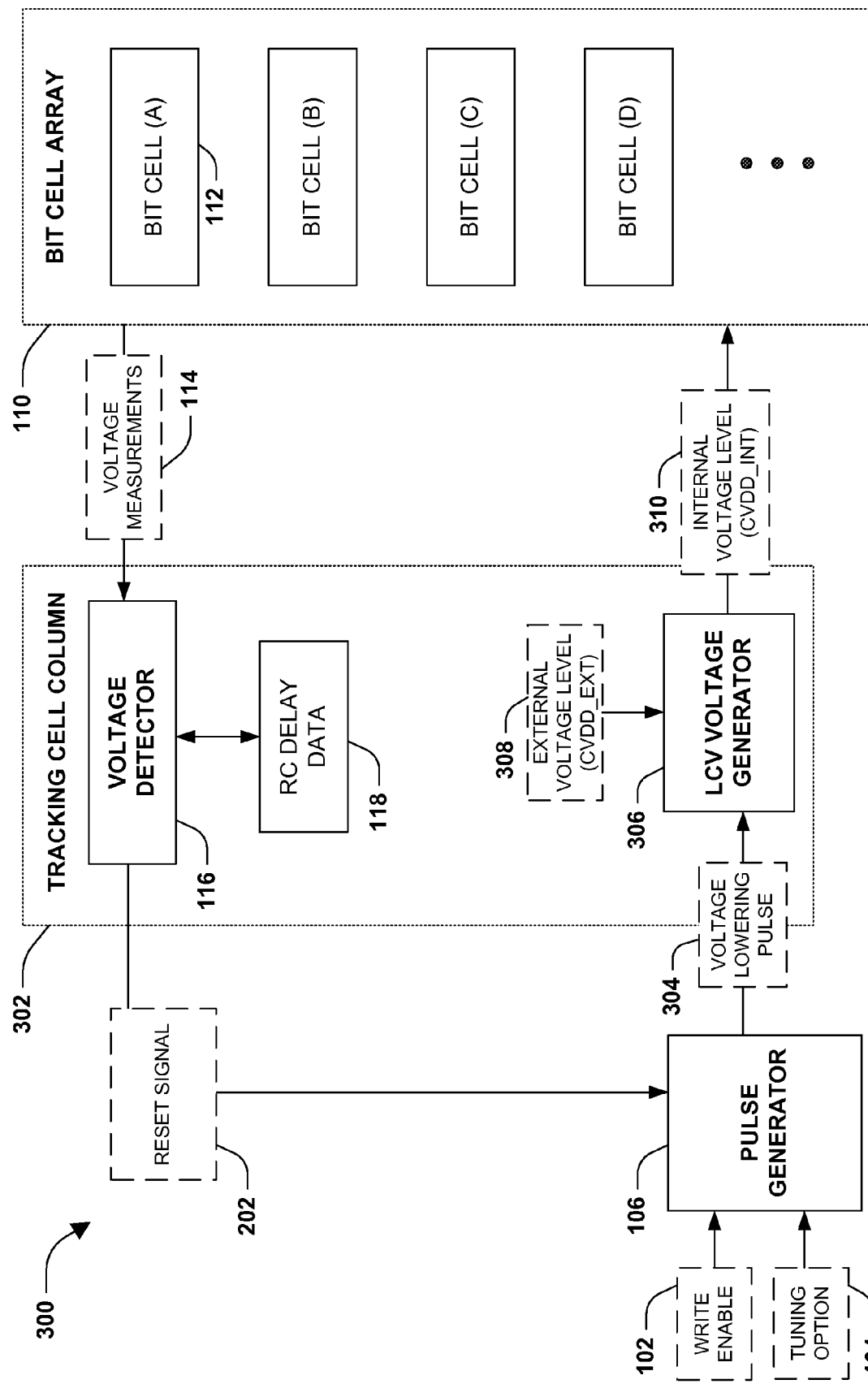
FIG. 3 is an illustration of an example of a system for facilitating a write operation to a bit cell, in accordance with various embodiments.

FIG. 3 illustrates an example, in accordance with various embodiments, of a system 300 configured for facilitating a write operation to a bit cell. The system 300 comprises a pulse generator 106 and a tracking cell column 302 associated with a memory device, such as an SRAM memory, comprising a bit cell array 110. The pulse generator 106 is configure to generate a voltage lowering pulse 304 based upon receiving a write enable signal 102 associated with a bit cell (e.g., a signal indicating that a write operation is to be performed upon a bit cell (A) 112 of the bit cell array 110). In some embodiments, the pulse generator 106 optionally generates the voltage lowering pulse 304 based upon a tuning option 104 (e.g., specifying various parameters for the voltage lowering pulse 304, such as a width). The voltage lowering pulse 304 triggers a loop control variable (LCV) voltage generator 306, comprised within the tracking cell column 302, to lower an internal voltage level 310 (e.g., CVDD_INT) associated with the bit cell (A) 112. For example, the internal voltage level 310 is initially set based upon an external voltage level 308 (e.g., CVDD_EXT). The LCV voltage generator 306 lowers the internal voltage level 310 so that a potential of the bit cell (A) 112 can be overcome the write operation associated with the write enable signal 102 (e.g., the bit cell (A) 112 is placed into a writeable voltage state).

The tracking cell column 302 comprises a voltage detector 116 and RC delay data 118. The RC delay data 118 is associated with the internal voltage level 310. For example, the RC delay data 118 corresponds to an RC delay from wire loading of the CVDD_INT (e.g., due to voltage variations along the CVDD_INT). The voltage detector 116 is configured to generate a reset signal 202 based upon the RC delay data 118. The voltage detector 116 sends the reset signal 202 to the pulse generator 106 based upon the LCV voltage generator 306 lowering the internal voltage level 310 past a reset trigger level (e.g., a voltage level defined based upon a data retention failure metric). For example, the voltage detector 116 monitors the internal voltage level 310 (e.g., voltage measurements 114), and compares the internal voltage level 310 to the reset trigger level in light of the RC delay data 118.

The pulse generator 106 is configured to modify the voltage lowering pulse 304 based upon receiving the reset signal 202. The modified voltage lowering pulse is sent to the LCV voltage generator 306, and invokes the LCV voltage generator 306 to charge the internal voltage level 310 to an original voltage level, such as the external voltage level 308. In this way, the internal voltage level 310 is charged to an original state based upon the reset signal 202 before one or more other bit cells experience data retention issues.

Figure 4:
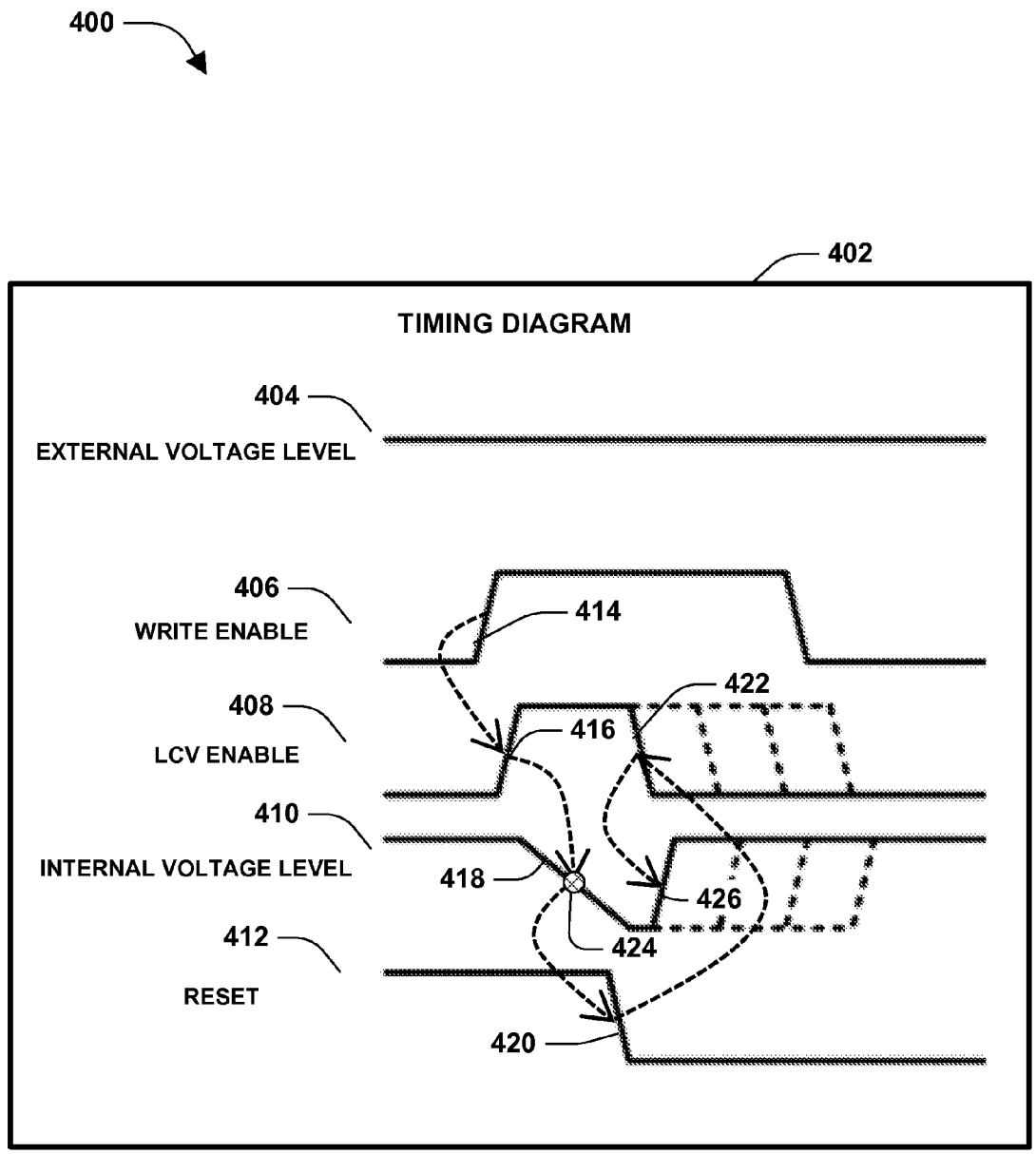
FIG. 4 is an illustration of an example of a timing diagram, in accordance with various embodiments.

FIG. 4 illustrates an example, in accordance with various embodiments, of a timing diagram 402. It is appreciated that in some embodiments, the timing diagram 402 is associated with the system 100 of FIG. 1, the system 200 of FIG. 2, or the system 300 of FIG. 3. The timing diagram comprises timing information associated with an external voltage level 404, a write enable signal 406, an LCV enable signal 408, an internal voltage level 410, and a reset signal 412. The external voltage level 404 is a voltage that is supplied to a memory device (e.g., a voltage supplied to one or more bit cells of a bit cell array). The external voltage level 404 is used to generate the internal voltage level 410, such as an overall internal voltage level, a write internal voltage level, or a read internal voltage level. Because the internal voltage level 410 is derived from the external voltage level 404, the internal voltage level 410 can have a similar or different voltage than the external voltage level 404. In some embodiments, the internal voltage level 410 is charged to an internal voltage corresponding to an external voltage of the external voltage level 404.

In some embodiments of lowering the internal voltage level 410 to facilitate a write operation to a bit cell associated with the internal voltage level 410, a write enable signal 406 transitions (e.g., a write enable signal transition 414) from a first state to a second state based upon a write operation that is to be performed on the bit cell. Based upon the write enable signal transition 414, a pulse generator transitions (e.g., an LCV enable transition 416) the LCV enable signal 408 from a first state to a second state. Based upon the LCV enable transition 416, a loop control variable (LCV) voltage generator lowers 418 the internal voltage level 410. In this way, the bit cell becomes susceptible to the write operation so that the write operation can be successfully performed.

When the internal voltage level 410 is lowered past a reset trigger level 424, a voltage detector sends the reset signal 412 (e.g., reset signal transition 420) to the pulse generator. Based upon the reset signal transition 420, the pulse generator transitions the LCV enable signal 408 from the second state to the first state (e.g., a second LCV enable transition 422). Based upon the second LCV enable transition 422, the LCV voltage generator charges 426 the internal voltage level 410 to the internal voltage corresponding to the external voltage of the external voltage level 404. In this way, lowering the internal voltage level 410 during the write operation is controlled based upon voltage feedback data, such as a comparison of a current internal voltage level 410 with the reset trigger level 424.

Figure 5:
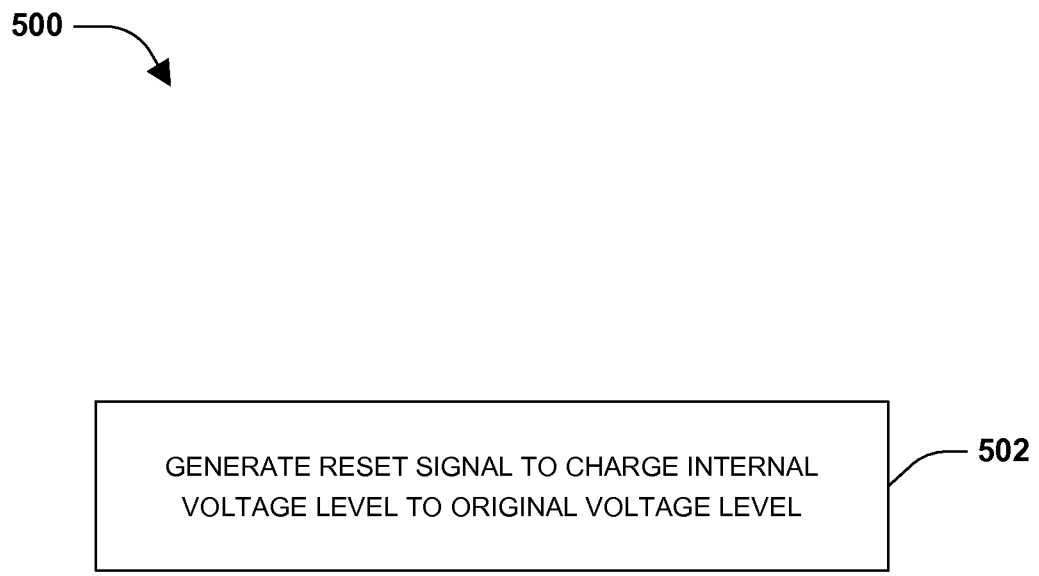
FIG. 5 is a flow diagram illustrating an example method of facilitating a write operation to a bit cell, in accordance with various embodiments.

An exemplary method 500 of facilitating a write operation to a bit cell in accordance with various embodiments of the present disclosure is illustrated in FIG. 5. At 502, responsive to detecting that an internal voltage level associated with a bit cell has been lowered past a reset trigger level during a write operation to the bit cell, a reset signal is generated. The reset signal may invoke a pulse generator to initialize charging of the internal voltage level to an original voltage level. In some embodiments, the internal voltage level comprises a CVDD internal voltage level for a memory device comprising the bit cell. In some embodiments, the reset trigger level is based upon a data retention failure metric associated with one or more unselected bit rows (e.g., bit cells that are different than the bit cell being written to by the write operation). In some embodiments, the reset signal is sent based upon RC delay data within a tracking cell column. The RC delay data is associated with the internal voltage level (e.g., an RC delay associated with voltage variations along a wire carrying the internal voltage level). In this way, the internal voltage level is lower during the write operation, and is then charged once the internal voltage level is lowered past a reset trigger level.

According to an aspect of the instant disclosure, a system for facilitating a write operation to a bit cell is provided. The system comprises a pulse generator. The pulse generator is configured to initialize lowering of an internal voltage level, such as by a voltage generator, associated with a bit cell based upon receiving a write enable signal associated with the bit cell (e.g., the write enable signal indicates that a write operation is to be performed on the bit cell). Lowering the internal voltage level may place the bit cell into a writeable voltage state, such that the bit cell is susceptible to being written to by the write operation. The system comprises a voltage detector configured to send a reset signal to the pulse generator based upon the pulse generator lowering the internal voltage level past a reset trigger level. In this way, the pulse generator initializes charging of the internal voltage level, such as by the voltage generator, based upon the reset trigger level.

According to an aspect of the instant disclosure, a system for facilitating a write operation to a bit cell is provided. The system comprises a pulse generator. The pulse generator is configured to generate a voltage lowering pulse based upon receiving a write enable signal associated with a bit cell. The system comprises a tracking cell column. The tracking cell column comprises a loop control variable (LCV) voltage generator that is configured to lower an internal voltage level of the bit cell based upon the voltage lowering pulse. The tracking cell column comprises RC delay data associated with the internal voltage level. The tracking cell column comprises a voltage detector. The voltage detector is configured to generate a reset signal based upon the RC delay data. The voltage detector is configured send the reset signal to the pulse generator based upon the LCV voltage generator lowering the internal voltage level past a reset trigger level. In this way, the pulse generator initializes charging of the internal voltage level based upon the reset trigger level.

According to an aspect of the instant disclosure, a method for facilitating a write operation to a bit cell is provided. The method comprises, detecting that an internal voltage level associated with a bit cell has been lowered past a reset trigger level during a write operation to the bit cell. In this way, a reset signal is generated based upon the internal voltage level being lowered past the reset trigger level. The reset signal is used to invoke a pulse generator to initialize charging of the internal voltage level to an original voltage level.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A system for facilitating a write operation to a bit cell, comprising:
   a pulse generator configured to:
      initialize lowering of an internal voltage level associated with a bit cell based upon receiving a write enable signal associated with the bit cell; and
   a voltage detector configured to:
      send a reset signal to the pulse generator based upon the pulse generator lowering the internal voltage level past a reset trigger level.

2. The system of claim 1, the pulse generator configured to:
   responsive to receiving the reset signal, initialize charging of the internal voltage level to an external voltage level.

3. The system of claim 1, the internal voltage level comprising a CVDD internal voltage level for a memory device comprising the bit cell.

4. The system of claim 1, the voltage detector configured to:
   specify a value for the reset trigger level based upon a data retention failure metric associated with one or more unselected bit rows.

5. The system of claim 1, the voltage detector associated with an RC delay circuit configured to provide RC delay data associated with the internal voltage level.

6. The system of claim 1, the pulse generator configured to:
   initialize lowering of the internal voltage level to a writable voltage state during a write operation triggered by the write enable signal.

7. The system of claim 1, the voltage detector comprising at least one of a buffer, a skewed inverter buffer, or a digital Schmitt trigger.

8. The system of claim 5, the RC delay circuit comprising a tracking cell column, and the voltage detector configured to:
   send the reset signal based upon RC delay data within the tracking cell column.

9. The system of claim 1, the pulse generator comprising a loop control variable pulse (LCV) generator configured to:
   generate a voltage lowering pulse that triggers an LCV voltage generator to control the lowering of the internal voltage level associated with the bit cell.

10. The system of claim 9, the pulse generator configured to:
    generate the voltage lowering pulse based upon a tuning option signal.

11. A method for facilitating a write operation to a bit cell, comprising:
    responsive to detecting that an internal voltage level associated with a bit cell has been lowered past a reset trigger level during a write operation to the bit cell, generating a reset signal to charge the internal voltage level to an original voltage level.

12. The method of claim 11, comprising:
    specifying a value for the reset trigger level based upon a data retention failure metric associated with one or more unselected bit rows.

13. The method of claim 11, comprising:
    storing RC delay data, associated with the internal voltage level, within RC delay circuitry.

14. The method of claim 13, the RC delay circuitry comprising a tracking cell column, and the method comprising:
    generating the reset signal based upon first RC delay data within the tracking cell column.

15. The method of claim 11, the internal voltage level comprising a CVDD internal voltage level for a memory device comprising the bit cell.

16. A system for facilitating a write operation to a bit cell, comprising:
    a pulse generator configured to control an internal voltage level associated with a bit cell; and
    a voltage detector configured to monitor the internal voltage level during a write operation of the bit cell, wherein:
       responsive to receiving a write enable signal associated with the bit cell to trigger the write operation, the pulse generator is configured to initialize a decrease in the internal voltage level;
       responsive to the internal voltage level decreasing below a reset trigger level during the write operation, the voltage detector is configured to generate a reset signal; and
       responsive the reset signal being detected at the pulse generator, the pulse generator is configured to initialize an increase in the internal voltage level.

17. The system of claim 16, the internal voltage level maintained at an original voltage level prior to the pulse generator initializing the decrease in the internal voltage level and wherein:
    the pulse generator is configured to initialize the increase in the internal voltage level to the original voltage level responsive to the reset signal being detected at the pulse generator.

18. The system of claim 16, the pulse generator configured to generate a voltage lowering pulse to initialize the decrease in the internal voltage level and the system comprising:
    a voltage generator configured to decrease the internal voltage level responsive to receiving the voltage lowering pulse.

19. The system of claim 18, the voltage generator comprising a loop control variable pulse (LCV) generator.

20. The system of claim 16, the reset trigger level determined based upon a data retention failure metric associated with one or more unselected bit rows.

* * * * *